US010165215B2

(12) United States Patent
Numata

(10) Patent No.: US 10,165,215 B2
(45) Date of Patent: Dec. 25, 2018

(54) IMAGING APPARATUS AND CONTROL METHOD FOR SOLID-STATE IMAGE SENSOR

(71) Applicant: CANON KABUSHIKI KAISHA, Tokyo (JP)

(72) Inventor: Aihiko Numata, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/215,832

(22) Filed: Jul. 21, 2016

(65) Prior Publication Data
US 2017/0034466 A1 Feb. 2, 2017

(30) Foreign Application Priority Data
Jul. 28, 2015 (JP) ................................. 2015-148895

(51) Int. Cl.
| H04N 3/14 | (2006.01) |
| H04N 5/335 | (2011.01) |
| H04N 5/378 | (2011.01) |
| H01L 27/146 | (2006.01) |

(52) U.S. Cl.
CPC ......... *H04N 5/378* (2013.01); *H01L 27/1461* (2013.01); *H01L 27/1463* (2013.01); *H01L 27/14605* (2013.01); *H01L 27/14621* (2013.01); *H01L 27/14627* (2013.01); *H01L 27/14641* (2013.01); *H01L 27/14645* (2013.01)

(58) Field of Classification Search
None
See application file for complete search history.

(56) References Cited

U.S. PATENT DOCUMENTS

| 8,625,010 | B2 | 1/2014 | Yamashita et al. |
| 9,040,888 | B2 | 5/2015 | Numata |
| 9,083,908 | B2 | 7/2015 | Yamashita et al. |
| 9,160,942 | B2 | 10/2015 | Numata |
| 9,307,170 | B2 | 4/2016 | Numata |
| 9,319,607 | B2 | 4/2016 | Numata |
| 9,402,041 | B2 | 7/2016 | Numata |
| 2008/0136948 | A1* | 6/2008 | Muramatsu ............ H04N 5/335 348/294 |

(Continued)

FOREIGN PATENT DOCUMENTS

JP 2004-120391 A 4/2004

OTHER PUBLICATIONS

Aihiko Numata, U.S. Appl. No. 15/111,242, filed Jul. 13, 2016.
Aihiko Numata, U.S. Appl. No. 15/111,250, filed Jul. 13, 2016.

*Primary Examiner* — Stephen P Coleman
(74) *Attorney, Agent, or Firm* — Venable LLP

(57) ABSTRACT

The present invention concerns an imaging apparatus having a plurality of pixels, each of the pixels including: a first photoelectric converter; a first pixel memory; a first transfer unit configured to transfer charges from the first photoelectric converter to the first pixel memory; a second photoelectric converter; a second pixel memory; a second transfer unit configured to transfer charges from the second photoelectric converter to the second pixel memory; and a switch adapted to control an electric connection state between the first pixel memory and the second pixel memory, wherein the exposure time of the first photoelectric converter is longer than the exposure time of the second photoelectric converter.

20 Claims, 12 Drawing Sheets

(56) References Cited

U.S. PATENT DOCUMENTS

| | | | |
|---|---|---|---|
| 2009/0218479 A1* | 9/2009 | Arishima | H01L 27/14623 250/226 |
| 2010/0182465 A1* | 7/2010 | Okita | H04N 5/343 348/273 |
| 2014/0016006 A1* | 1/2014 | Tashiro | H04N 5/3741 348/281 |
| 2014/0022354 A1* | 1/2014 | Okigawa | H04N 5/347 348/46 |
| 2016/0225805 A1* | 8/2016 | Keelan | H01L 27/14605 |

* cited by examiner

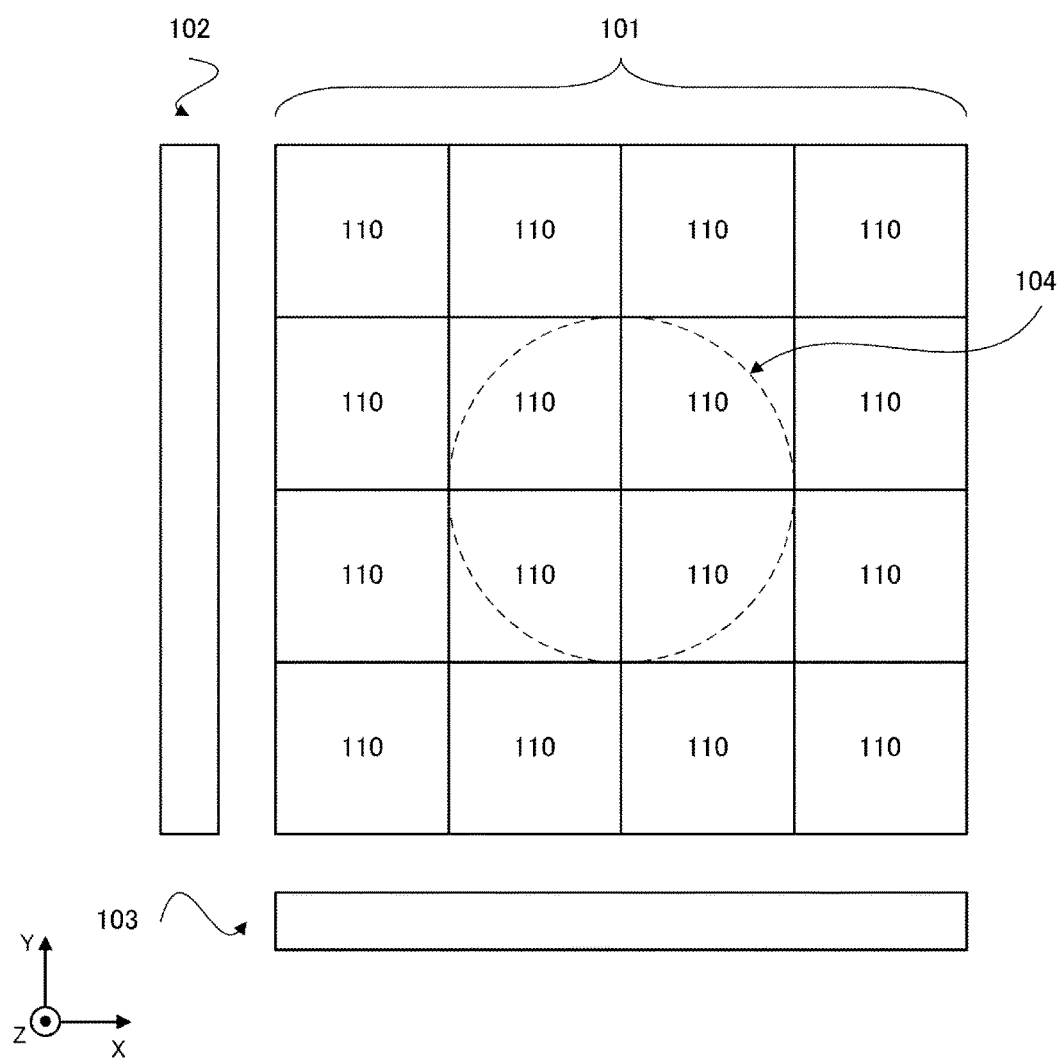

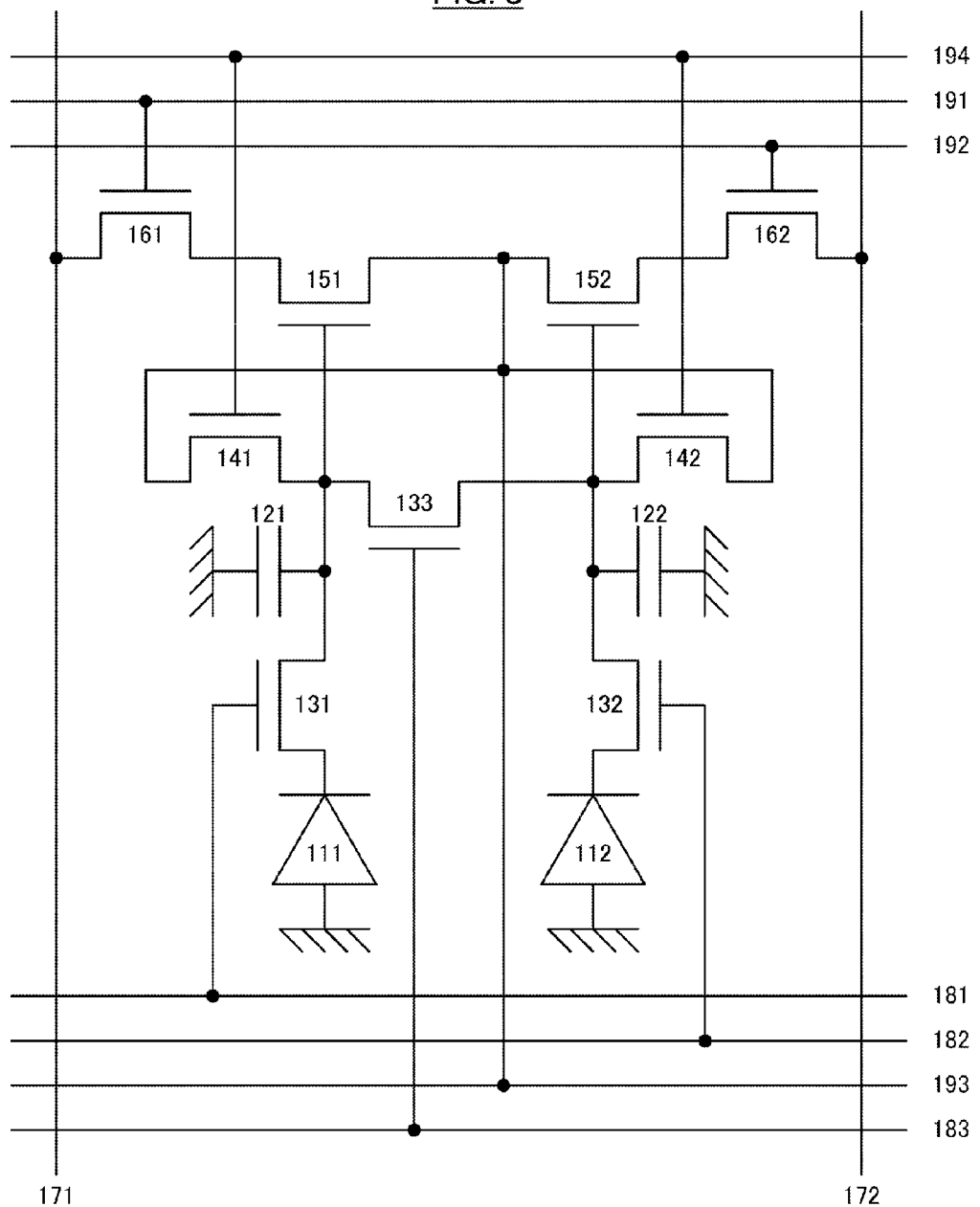

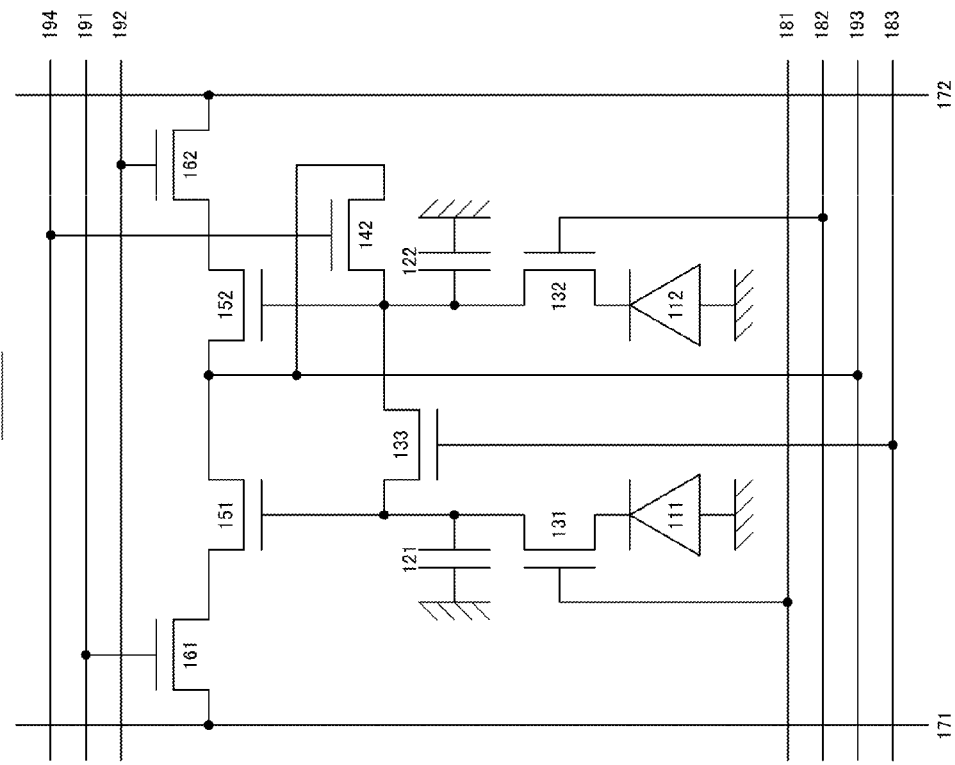
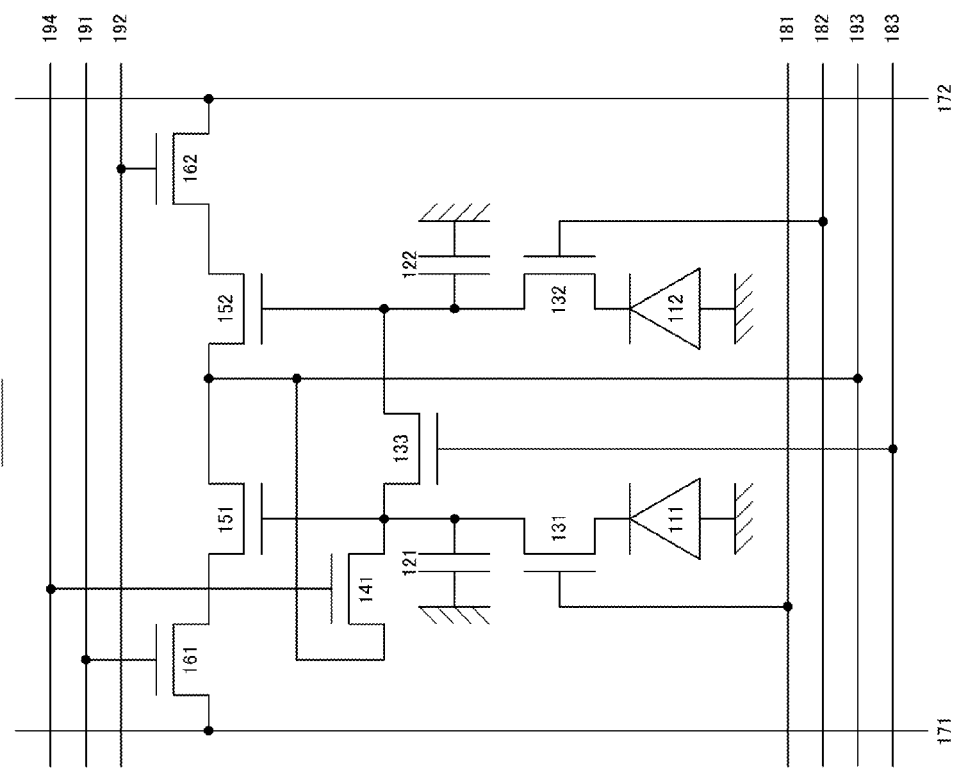

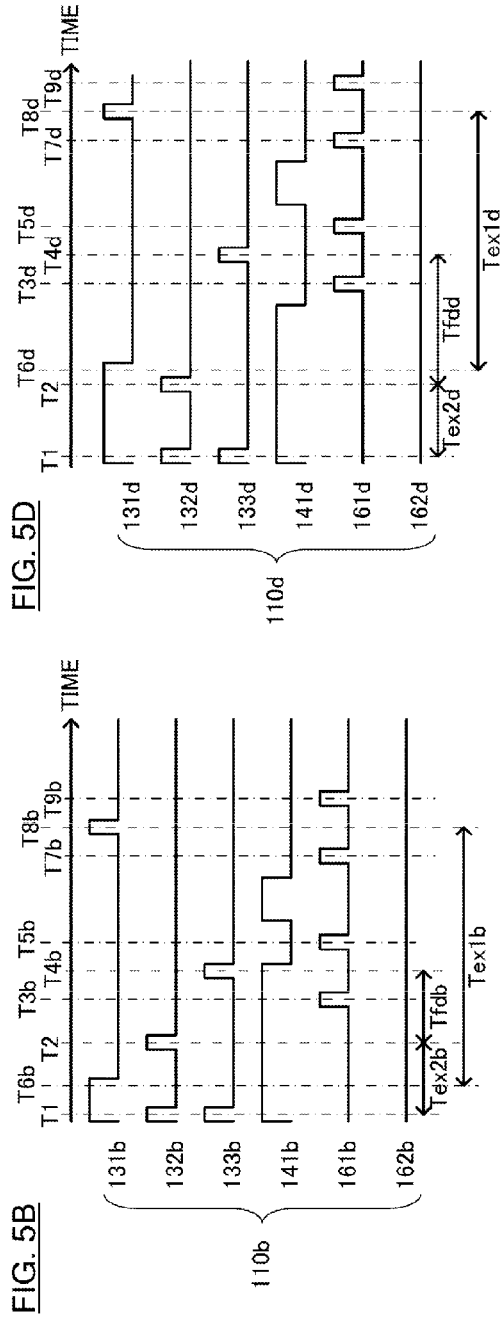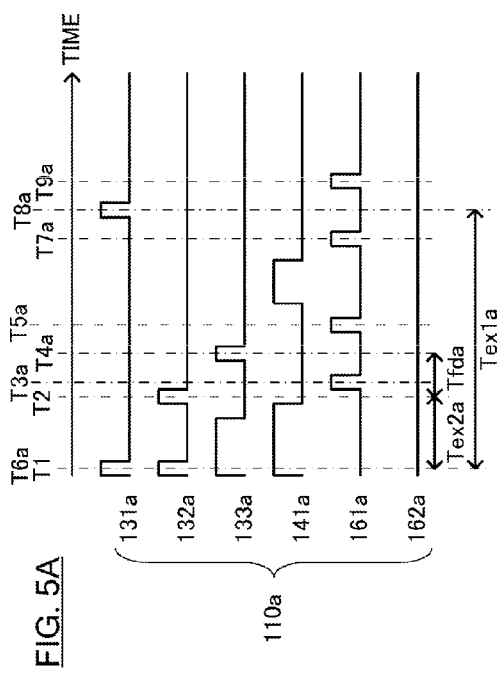

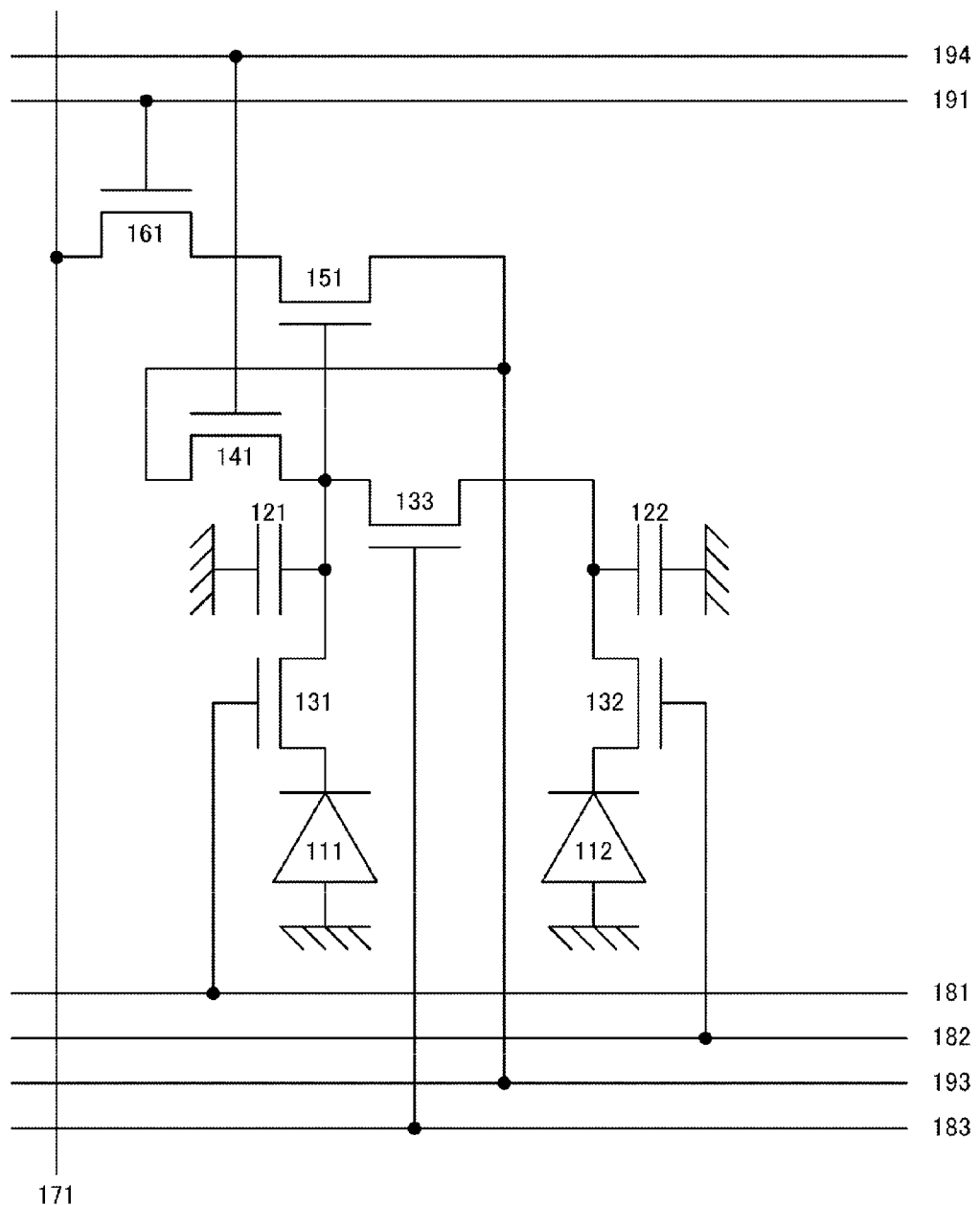

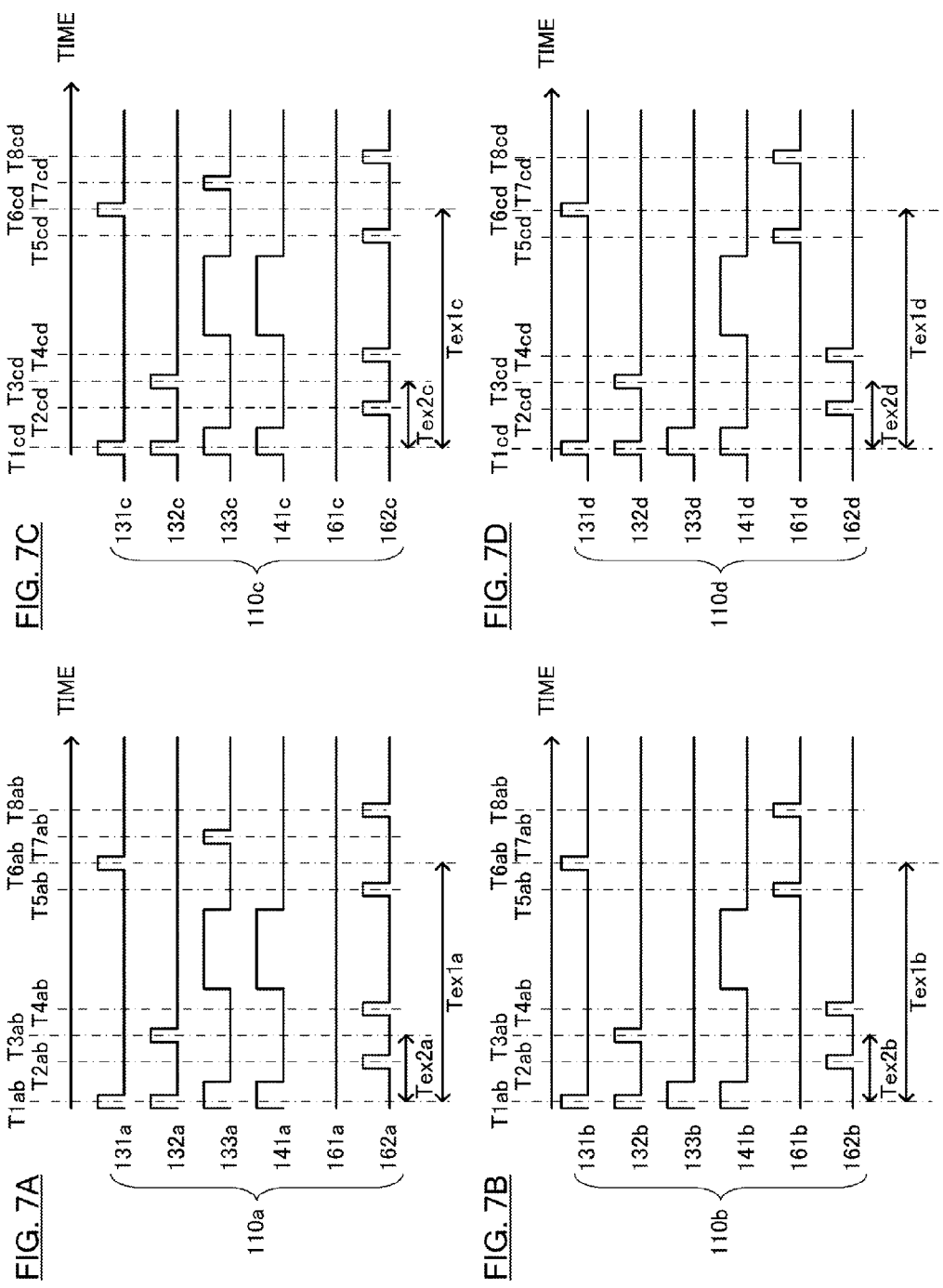

IMAGING APPARATUS AND CONTROL METHOD FOR SOLID-STATE IMAGE SENSOR

BACKGROUND OF THE INVENTION

Field of the Invention

The present invention relates to a solid-state image sensor, and more particularly to a solid-state image sensor that is used for a digital camera or the like.

Description of the Related Art

Recently, demands for a camera that can simultaneously acquire a moving image and a still image are increasing. Generally, in order to acquire a smooth moving image, it is desirable to capture images with an exposure time equivalent to the read frame rate of a solid-state image sensor. For a still image, on the other hand, it is preferable to set an exposure time corresponding to the speed of the motion of the object. This means that two types of pixel signals with different exposure times must be acquired to simultaneously acquire a still image and a moving image. To simultaneously acquire a moving image and a still image having a same brightness, the sensitivity of a pixel must be varied according to the duration of the exposure time, since the quantity of light that enters a pixel is in proportion to the exposure time. In a technique proposed in Japanese Patent Application Laid-open No. 2004-120391, a plurality of photoelectric converters having different aperture ratios are disposed in a pixel, and a different exposure time is set for each photoelectric converter, whereby a pixel signal for a moving image and a pixel signal for a still image can be acquired from each photoelectric converter.

Patent Document 1: Japanese Patent Application Laid-open No. 2004-120391.

SUMMARY OF THE INVENTION

When the solid-state image sensor disclosed in Japanese Patent Application Laid-open No. 2004-120391 is used, both a moving image and a still image can be acquired. However, increased demands for even better image quality of a moving image and a still image, and requests for improved functions of a solid-state image sensor and imaging apparatus, such as lower power consumption, are escalating.

With the foregoing in view, it is an object of the present invention to further improve the functions of an imaging apparatus that can simultaneously acquire a moving image and a still image.

A first aspect of the present invention is an imaging apparatus having a plurality of pixels, each of the pixels including: a first photoelectric converter; a first pixel memory; a first transfer unit configured to transfer charges from the first photoelectric converter to the first pixel memory; a second photoelectric converter; a second pixel memory; a second transfer unit configured to transfer charges from the second photoelectric converter to the second pixel memory; and a switch adapted to control an electric connection state between the first pixel memory and the second pixel memory, and an exposure time of the first photoelectric converter is longer than an exposure time of the second photoelectric converter.

According to the present invention, the functions of a conventional imaging apparatus, that can simultaneously acquire a moving image and a still image, can be further improved.

Further features of the present invention will become apparent from the following description of exemplary embodiments with reference to the attached drawings.

BRIEF DESCRIPTION OF THE DRAWINGS

FIG. 1 is a diagram depicting a solid-state image sensor according to an embodiment;

FIG. 3 is a circuit diagram of a pixel of the solid-state image sensor according to the embodiment;

FIGS. 4A and 4B are modifications of the circuit diagram of a pixel of the solid-state image sensor according to the embodiment;

FIGS. 5A to 5D show an operation flow of a solid-state image sensor according to Example 1;

FIG. 6 is a modification of the circuit diagram of a pixel of the solid-state image sensor according to Example 1;

FIGS. 7A to 7D show an operation flow of a solid-state image sensor according to Example 2;

DESCRIPTION OF THE EMBODIMENTS

Figure 2A:
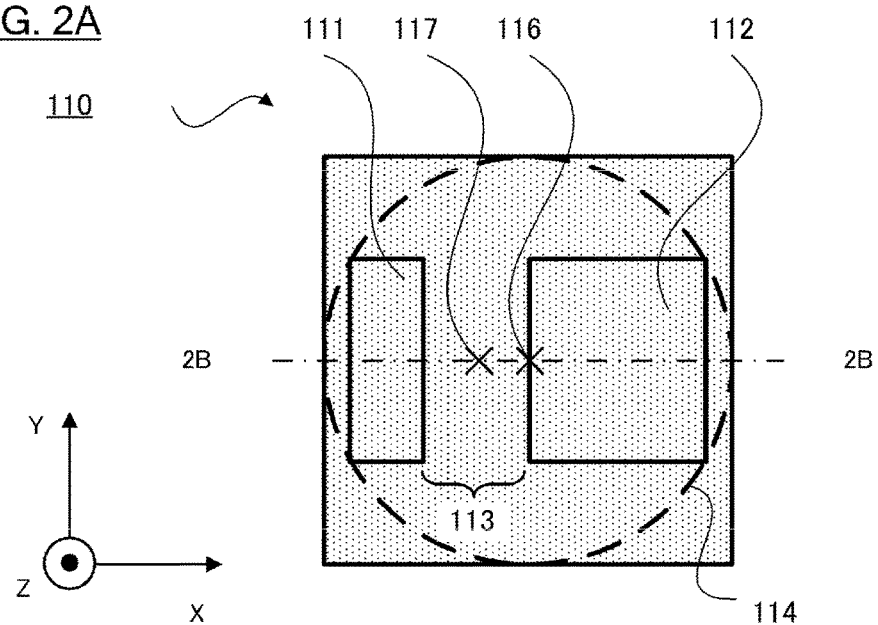
FIGS. 2A and 2B are diagrams depicting a configuration of a pixel disposed in a center region of the solid-state image sensor according to the embodiment.

A solid-state image sensor of the present invention will now be described with reference to the drawings. In all the drawings, a composing element having a same function is annotated with a same reference numeral, and redundant description is omitted.

<Image Sensor>

FIG. 1 is a schematic diagram depicting an example of a solid-state image sensor 100 according to this embodiment. The solid-state image sensor 100 has a pixel region 101 in which a plurality of pixels 110 are disposed, and a region where a vertical scanning circuit 102 and a horizontal scanning circuit 103 are disposed. The vertical scanning circuit 102 and the horizontal scanning circuit 103 are collectively called a "scanning circuit" (peripheral circuit). The pixels 110 are controlled by a signal from the scanning circuit regarding exposure and reading of a pixel signal.

In the example in FIG. 1, four pixels 110 are disposed in the row direction and four pixels 110 are disposed in the column direction in the pixel region 101, but the arrangement of the pixels 110 is not limited to this example. In the drawings, the row direction is the X direction and the column direction is the Y direction.

<Pixel Structure>

Figure 2B:
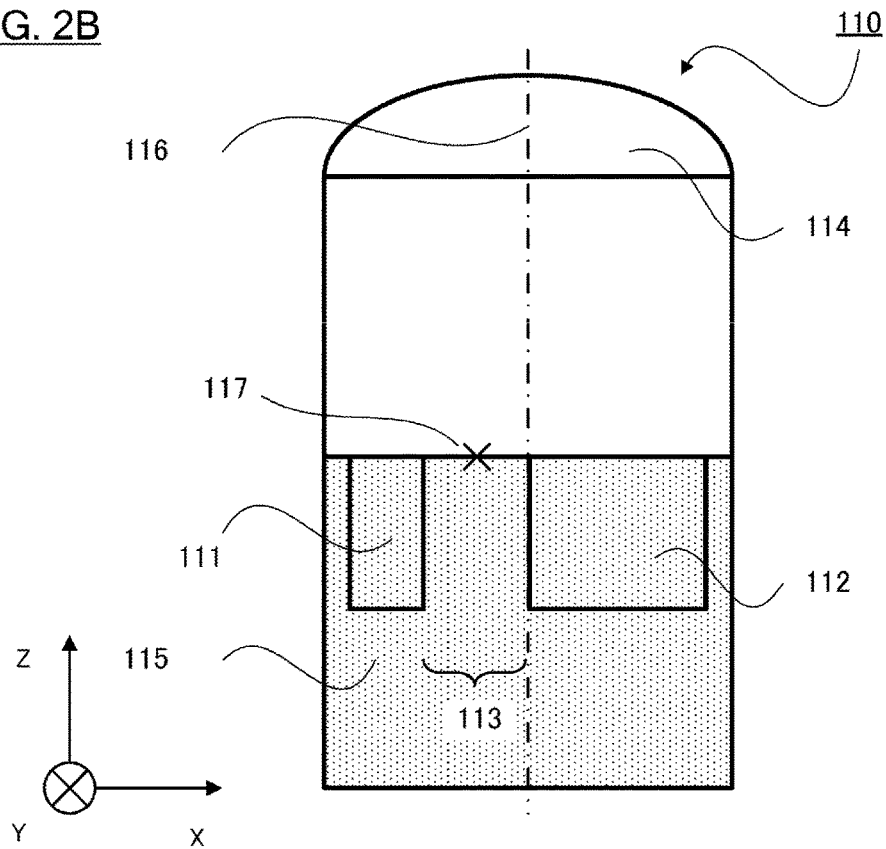

FIGS. 2A and 2B are schematic diagrams depicting a structure of a pixel 110 that is disposed in a center region 104 of the pixel region 101. "A pixel that is disposed in a center region" means a pixel 110 of which center of gravity is included inside the center region 104. The center region 104 is a region of which distance from the center of the pixel region 101 is a predetermined value or less. The predetermined value is preferably a value that is ¼ or less the length of the diagonal line of the pixel region 101, and more preferably is a value that is 1/20 or less the length of the diagonal line of the pixel region 101. In FIG. 1, the predetermined length of the center region 104 is about 1/5 the diagonal line of the pixel region 101. In this case, the four pixels at the center correspond to the pixels disposed in the center region.

FIG. 2A shows a layout of the pixel 110 when the surface of a substrate is viewed from the Z axis direction, which is vertical to the substrate, and FIG. 2B is a diagram depicting the XZ cross-section at the dashed line 2B-2B in FIG. 2A. The pixel 110 has a first photoelectric converter (first photo diode) 111 and a second photoelectric converter (second photo diode) 112 disposed on a substrate 115, and a light collecting unit. The light collecting unit is constituted by a micro-lens 114 or the like, which is disposed on the light entry side of the photoelectric converters 111 and 112, and collects the incident light that enters the pixel 110 to the photoelectric converters 111 and 112. An optical axis 116 of the micro-lens 114 is disposed to be shifted toward the second photoelectric converter 112 with respect to the center 117 of a barrier region 113 disposed between the photoelectric converter 111 and the photoelectric converter 112. In other words, the optical axis 116 of the micro-lens is disposed closer to the second photoelectric converter 112 than to the first photoelectric converter 111. By this configuration, the sensitivity of the second photoelectric converter 112 is higher than the first photoelectric converter 111. The sensitivity of the photoelectric converter is defined by a ratio of the charge amount stored in the photoelectric converter with respect to the quantity of light that enters the pixel per unit time.

The photoelectric converters 111 and 112 are generated by forming a potential distribution (by ion implantation or the like) in the substrate 115 constituted by such a material as silicon that absorbs light in the wavelength band to be detected. The barrier region 113 has a potential barrier to suppress charge cross-talk between the first photoelectric converter and the second photoelectric converter. The barrier region 113 is a region which has a potential exceeding the 90% or more of the potential barrier formed between the first photoelectric converter 111 and the second photoelectric converter 112 (the maximum value of the potential barrier must be included).

The potential barrier may be formed by implanting ions into a region corresponding to the barrier region 113, instead of regions corresponding to the photoelectric converters 111 and 112. Ions may be implanted into the regions corresponding to both the photoelectric converters and the barrier region. In this case, it is preferable that the ions to be implanted into the regions corresponding to the photoelectric converters and the ions to be implanted into the region corresponding to the barrier region have opposite conductivity.

The photoelectric converter 111 and the photoelectric converter 112 need not be disposed side by side in the X axis direction, as shown in FIG. 2A, but may be disposed side by side in a direction that forms an angle larger than 0° with the X axis. The direction of disposing the photoelectric converters is defined as "a direction of a line connecting the centers of the photoelectric converters". The shape of the apertures of the first photoelectric converter 111 and the second photoelectric converter 112 on the surface of the substrate need not be rectangular, as shown in FIG. 2A, but may be circular, elliptical, polygonal or the like. The corners of a polygon may be rounded in the manufacturing process.

In the example shown in FIG. 2A, the aperture area of the photoelectric converter 111 and that of photoelectric converter 112 are different, but may be the same. Even if the aperture areas are the same, the sensitivity of the photoelectric converter 112 can be higher than that of the photoelectric converter 111 only if the optical axis of the micro-lens 114 is shifted toward the photoelectric converter 112 with respect to the center of the barrier region 113.

Furthermore, a wave guide may be used for the light collecting unit, instead of the micro-lens, or both a micro-lens and a wave guide may be used. If a wave guide is used, the center of the emission end of the core of the wave guide is shifted toward the second photoelectric converter 112 with respect to the center of the barrier region 113. In other words, the center of the emission end of the core of the wave guide is disposed closer to the second photoelectric converter 112 than to the first photoelectric converter 111. If this configuration is used, the sensitivity of the photoelectric converter 112 can be higher than that of the photoelectric converter 111.

The positional relationship between the light collecting unit and the barrier region is adjusted so that the sensitivity of the second photoelectric converter 112 is higher than the sensitivity of the first photoelectric converter 111, even in a peripheral region other than the center region 104 of the pixel region 101. Normally the principal ray that enters a pixel is inclined in the peripheral region, hence the shift amount between the light collecting unit and the barrier region can be adjusted by this amount of inclination.

<Circuit Diagram>

FIG. 3 is a diagram showing the circuit configuration of the pixel 110. The pixel 110 includes the first photoelectric converter 111, the second photoelectric converter 112, a first pixel memory (first memory in the pixel) 121 and a second pixel memory (second memory in the pixel) 122. In the pixel 110, a first transfer unit (transfer transistor 131) that transfers charges from the photoelectric converter 111 to the pixel memory 121, and a second transfer unit (transfer transistor 132) that transfers charges from the photoelectric converter 112 to the pixel memory 122, are disposed. The pixel memory 121 is connected to the drain power line 193 via a reset transistor 141, and the pixel memory 122 is connected to the drain power line 193 via a reset transistor 142 respectively.

The charges transferred to the pixel memory 121 are converted into a voltage signal via a source follower 151, and can be read and transferred to a signal line 171 by a selection line 191 and a select transistor 161. In the same manner, the charges transferred to the pixel memory 122 are converted into a voltage signal via a source follower 152, and can be read and transferred to a signal line 172 by a selection line 192 and a select transistor 162.

The first photoelectric converter 111 and the second photoelectric converter 112 are driven by signals that are sent from the vertical scanning circuit 102 via the transfer lines 181 and 182 and the reset lines 194 respectively, such that the exposure time of the first photoelectric converter 111 is longer than the exposure time of the second photoelectric converter 112. The operation of the scanning circuit is controlled by inputting an electric control pulse to the scanning circuit from a controller that is disposed outside the solid-state image sensor.

In the solid-state image sensor 100 of this embodiment, a switch (a driving line 183 and a transistor 133) that can change the electric connection state between the first pixel memory 121 and the second pixel memory 122 using a signal from the scanning circuit is disposed. By this configuration, even more advanced functions can be implemented compared with the conventional solid-state image sensor. The solid-state image sensor 100 will be described in comparison with the conventional solid-state image sensor 1000.

<Conventional Solid-State Image Sensor>

Figure 12B:
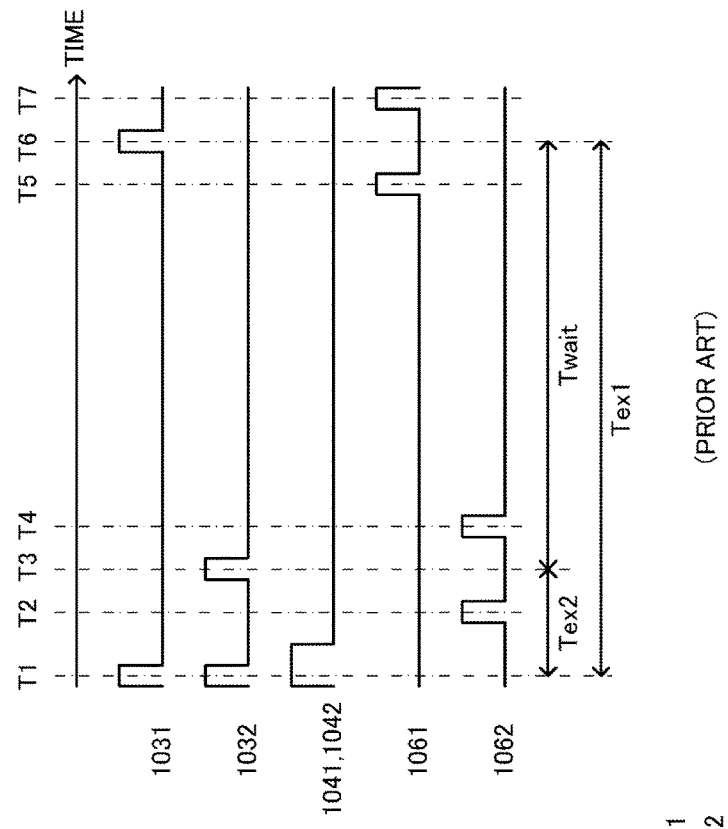
FIGS. 12A and 12B show a circuit diagram and an operation flow of a pixel of a conventional solid-state image sensor.
Figure 12A:
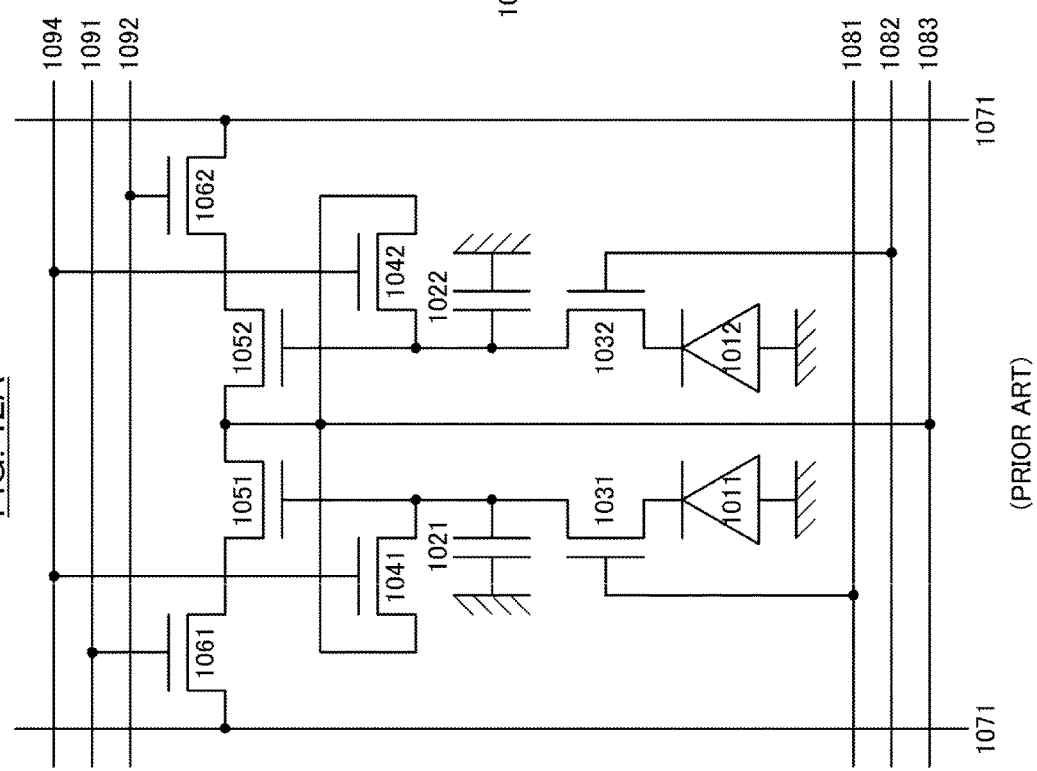

FIG. 12A shows a circuit configuration of a pixel 1010 of the conventional solid-state image sensor 1000. A difference of the pixel 1010 from the pixel 110 of the solid-state image sensor 100 of this embodiment is that the switch for changing the electric connection state between two pixel memories 1021 and 1022 is not disposed. The operation flow in the pixel 1010 will now be described with reference to FIG. 12B.

First the transfer transistors 1031 and 1032 and the reset transistors 1041 and 1042 are turned ON to reset the photoelectric converters 1011 and 1012 and the pixel memories 1021 and 1022. Then at time T1, the transfer transistors 1031 and 1032 are turned OFF to start exposure of the photoelectric converters 1011 and 1012.

At time T2 during exposure of the photoelectric converter 1012, a select transistor 1062 is turned ON to read the reading noise of a source follower 1052. Then at time T3, the transfer transistor 1032 is turned ON to end the exposure of the photoelectric converter 1012, and transfer the charges stored in the photoelectric converter 1012 to the pixel memory 1022. In other words, the period from time T1 to time T3 (Tex2) corresponds to the exposure time of the photoelectric converter 1012.

Then at time T4, the select transistor 1062 is turned ON to read a pixel signal based on the charges held in the pixel memory 1022. The pixel signal acquired at time T4 includes the reading noise of the source follower 1052, hence a true pixel signal is acquired by subtracting the reading noise component acquired at time T2 from the pixel signal acquired at time T4 (this is normally called "correlated double sampling"). At this point the pixel signal based on the charges stored in the photoelectric converter 1012 can be acquired.

Then a pixel signal based on the charges stored in the photoelectric converter 1011 is acquired. The basic operation flow is the same as the method for reading the pixel signal based on the charges stored in the photoelectric converter 1012. In other words, at time T5 during exposure of the photoelectric converter 1011, a select transistor 1061 is turned ON to read the reading noise of a source follower 1051. Then at time T6, the transfer transistor 1031 is turned ON to end the exposure of the photoelectric converter 1011, and transfer the charges stored in the photoelectric converter 1011 to the pixel memory 1021. Finally at time T7, the select transistor 1061 is turned ON to read a pixel signal including the reading noise, and correlated double sampling is performed, whereby the pixel signal based on the charges stored in the photoelectric converter 1011 can be acquired. The exposure time of the photoelectric converter 1011 is from time T1 to time T6 (Tex1), which is longer than the exposure time of the photoelectric converter 1012.

As the operation flow in FIG. 12B shows, in the case of the conventional solid-state image sensor 1000, only the pixel memory 1021 and the transistors 1031, 1041, 1051 and 1061 connected thereto are used to read the signal stored in the photoelectric converter 1011. In the same manner, only the pixel memory 1022 and the transistors 1032, 1042, 1052 and 1062 connected thereto are used to read the signal stored in the photoelectric converter 1012.

<Comparison of this Embodiment and Prior Art>

In the case of the solid-state image sensor 100 of this embodiment, on the other hand, the switch that can change the electric connection state between the pixel memories 121 and 122 is disposed, hence both of the pixel memories 121 and 122 can be used to read the signals of the photoelectric converters 111 and 112. Thereby the functions of the conventional solid-state image sensor 1000 can be improved. A concrete example of functional improvement will be described later with examples.

In order to use both the pixel memories 121 and 122 to read the signals of the photoelectric converters 111 and 112, it is critical that the exposure end timings of the photoelectric converters 111 and 112 are different. If the exposure start timings of the photoelectric converters 111 and 112 are the same, the exposure end timings become different when the respective exposure time is different.

If the exposure start timings and the exposure end timings of the photoelectric converters 111 and 112 are the same respectively, the charge transfer timing from the photoelectric converter 111 to the pixel memory 121 and the charge transfer timing from the photoelectric converter 112 to the pixel memory 122 are the same. Therefore in order to use the pixel memories 121 and 122 to read the signals of the photoelectric converters, charges must be held in either one of the pixel memories while the charges held in the other pixel memory is read. As a result, dark current noise may enter the charges being held, and the quality of the pixel signal may deteriorate, or a delay may occur in the reading of the signal and the frame rate may drop.

In the case of the solid-state image sensor 100 of this embodiment, on the other hand, the exposure time of the photoelectric converter 111 is longer than the exposure time of the photoelectric converter 112, and the timing to read the signal of the photoelectric converter 111 is also different from the timing to read the signal of the photoelectric converter 112. As a result, both of the pixel memories 121 and 122 can be used to read the signal stored in the photoelectric converter 111, or both of the pixel memories 121 and 122 can be used to read the signal stored in the photoelectric converter 112.

<Modifications>

In FIG. 3, both the reset transistor 141 to be connected to the pixel memory 121 and the reset transistor 142 to be connected to the pixel memory 122 are disposed. In other words, the pixel 110 has a first reset unit connected to the pixel memory 121 and a second reset unit connected to the pixel memory 122, as shown in FIG. 3.

However one of the reset transistors may be omitted, as shown in FIG. 4A or 4B. This is because the electric connection state between the pixel memories 121 and 122 can be changed by the driving line 183 and the transistor 133, therefore one of the reset transistors can be used to reset both of the pixel memories 121 and 122. In other words, the pixel 110 may have only one of the first reset unit connected to the pixel memory 121 and the second reset unit connected to the pixel memory 122, as shown in FIG. 3.

If one of the reset transistors is not disposed as shown in FIG. 4A or 4B, a number of transistors is the same as that of the conventional solid-state image sensor. Increasing a number of transistors normally decreases the aperture ratio of the photoelectric converters, and drops the sensitivity, or makes it difficult to manufacture the solid-state image sensor. If the configuration in FIG. 4A or 4B is used, the functions of the conventional image sensor, shown in FIG. 12A, can be improved without increasing a number of transistors, which is very desirable.

Example 1: Applied to a Global Shutter

A solid-state image sensor that implements a global shutter by using both of the pixel memories 121 and 122 to read the signal from the photoelectric converter will be described in Example 1. In the following, a case of reading the global shutter to read the second pixel signal, based on the charges stored in the photoelectric converter 112, using the pixel shown in FIG. 4A, will be described as an example.

<Operation Flow>

FIGS. 5A to 5D are diagrams depicting the operation flow to implement a global shutter using the solid-state image sensor of Example 1. FIGS. 5A to 5D show the respective operation flow in a plurality of pixels 110a, 110b, 110c and 110d, which are arranged in a same column. The operation of each pixel is controlled based on the signal from the scanning circuit. Characters a to d attached to each reference sign in each diagram correspond to the pixels 110a, 110b, 110c and 110d, but the characters a to d are omitted if the description is common to all pixels. In FIGS. 5A to 5D, the times T1 and T2 are the same timings for all pixels. Further, FIGS. 5A to 5D also indicate the exposure times Tex1 and Tex2 of the photoelectric converters 111 and 112, and the time Tfd which is a time for holding the charges stored in the photoelectric converter 112 in the pixel memory 122.

First the operation to acquire the second pixel signal based on the charges stored in the photoelectric converter 112 will be described. The transistors 132, 133 and 141 are turned ON to reset the photoelectric converter 112 and the pixel memories 121 and 122. Then the transfer transistor 132 is turned OFF at time T1, which is the same timing as the pixels in different rows, to start exposure of the photoelectric converter 112.

After turning the transistor 133 OFF, the transistor 132 is turned ON at time T2, which is the same timing as the pixels in different rows, to end the exposure of the photoelectric converter 112, and transfers the charges stored in the photoelectric converter 112 to the pixel memory 122. In other words, the period from time T1 to time T2 corresponds to the exposure time Tex2 of the photoelectric converter 112.

At time T3, while the charges stored in the photoelectric converter 112 are held in the pixel memory 122, the select transistor 161 is turned ON to read the reading noise of the source follower 151. Then at time T4, which is different depending on the row, the transistor 133 is turned ON to transfer the charges held in the pixel memory 122 to the pixel memory 121.

Then at time T5, the select transistor 161 is turned ON to read the charges held in the pixel memory 121, that is the signal based on the charges stored in the photoelectric converter 112. Then similarly to the conventional solid-state image sensor, correlated double sampling is performed to subtract the noise component which was read at time T3, whereby the second pixel signal can be acquired.

By changing the time Tfd for holding the charges in the pixel memory 122 depending on the row like this, the timing to read the second pixel signal (time T5) can be changed depending on the row, while maintaining the same exposure start time T1 and exposure end time T2 of the photoelectric converter 112 in all the rows. In other words, the second pixel signal acquisition using the global shutter can be implemented. By acquiring the image using the global shutter, image distortion, when an object moving at high-speed is photographed, can be reduced, and image quality can be improved.

Now the operation to acquire the first pixel signal based on the charges stored in the photoelectric converter 111 will be described. The operation flow to acquire the first pixel signal is the same as the conventional solid-state image sensor. The transistors 131 and 141 are turned ON to reset the photoelectric converter 111 and the pixel memory 121, and then at time T6, the transfer transistor 131 is turned OFF to start exposure of the photoelectric converter 111. At time T7 during the exposure of the photoelectric converter 111, the reading noise is read, and at time T8, the charges stored in the photoelectric converter 111 are transferred to the pixel memory 121, and then at time T9, the signal that includes the reading noise is read. By performing correlated double sampling to subtract the noise component which was read at time T7, the first pixel signal can be acquired. The reset transistor 141 is turned ON before time T7 because the charges transferred to the pixel memory 121 are reset at time T4.

As shown in FIGS. 5A to 5D, the exposure start time T6 and the exposure end time T8 of the photoelectric converter 111 are different depending on the row. In other words, the first pixel signal is read by a rolling shutter.

When the charges stored in the photoelectric converter 111 are read, correlated double sampling may be performed using the reading noise acquired at time T3, instead of the reading noise which was read at time T7. In this case, one reading operation can be omitted, hence power consumption can be conserved. However, the reading noise is related to time, and it is therefore preferable to read the reading noise again at a timing close to time T9 and perform correlated double sampling, as shown in FIGS. 5A to 5D, in terms of noise reduction.

As described above, the following effect can be obtained by disposing the driving line 183 and the transistor 133 in the solid-state image sensor shown in Example 1. That is, the signal, based on the charges stored in the photoelectric converter 112, can be held in the pixel memory 122 for a predetermined time, and then be transferred again to the pixel memory 121 and read. Thereby when the second pixel signal is acquired, the global shutter can be implemented while performing correlated double sampling.

<Pixel Memory>

In the solid-state image sensor 100 shown in Example 1, charges are transferred from the pixel memory 122 to the pixel memory 121, but not from the pixel memory 121 to the pixel memory 122. Therefore to completely transfer the charges from the pixel memory 122 to the pixel memory 121, it is preferable that the potential well of the first pixel memory 121 is deeper than the potential well of the second pixel memory 122. In concrete terms, it is preferable that the concentration of impurities to form the PN junction of the pixel memory 121 is higher than the concentration of impurities of the pixel memory 122. For example, in the case of an NMOS type, where the PN junction is formed by implanting donor impurities into a p-type well, the concentration of the donor impurities to be implanted into the region of the pixel memory 121 is set to be higher than the concentration of the donor impurities to be implanted into the region of the pixel memory 122. Typically, it is preferable that the average concentration of impurities in the first pixel memory 121 is two times or more the average concentration of impurities in the second pixel memory 122.

Further, the time for holding the charges in the pixel memory 122 is longer than the time for holding the charges in the pixel memory 121. Therefore it is preferable that the second pixel memory 122 is a buried channel type to reduce the dark current. For example, in the case of an NMOS type, where the PN junction is formed by implementing donor impurities into a p-type well, a high concentration of acceptor impurities are implanted into the outermost surface of the N-type semiconductor formed in the region of the pixel memory 122. The pixel memory 121 can also be a buried channel type, but additional manufacturing steps for forming the buried channel must be included, hence the pixel memory 121, of which the time for holding charges is short, need not be a buried channel type.

<Omission of One Source Follower>

In the case of the solid-state image sensor of Example 1, both the first pixel signal and the second pixel signal are read using the source follower 151, the select transistor 161 and the signal line 171, which are connected to the pixel memory 121. This means that the source follower 152, the select transistor 162, the signal line 172 and the selection line 192, which are connected to the pixel memory 122, need not be disposed as shown in FIG. 6. By using the configuration in FIG. 6, a number of transistors and a number of wirings that are required can be decreased compared with the conventional solid-state image sensor. As a result, the aperture ratios of the photoelectric converters 111 and 112 can be increased in order to improve sensitivity, and manufacturing of the solid-state image sensor becomes easier.

In other words, it is preferable that the pixel 110 has only one converter to convert the charge amount held in the pixel memory into the voltage signal, and this converter is connected to the first pixel memory 121.

<Pseudo-Global Shutter>

FIGS. 5A to 5D show a case when the exposure start time T1 and the exposure end time T2 of the photoelectric converter 112 are the same timings as the pixels in different rows. However T1 and T2 may be different from those of the pixels in different rows as long as the image distortion is reduced compared with the case of acquiring the image using the rolling shutter. In concrete terms, it is sufficient if the charge holding time Tfd in the pixel memory 122 is longer in a pixel, from which a signal is read and transferred to the signal line 171 at a later timing (a pixel located in the lower row in the case of FIGS. 5A to 5D). However it is preferable that the exposure start time T1 and the exposure end time T2 of the photoelectric converter 112 in a pixel are at the same timings as the pixels in different rows, because image distortion, generated when photographing an object moving at high-speed, can be further reduced.

<First Signal Reading Method>

The above is a case when reading using the global shutter is executed only when the second pixel signal is read from the photoelectric converter 112, of which exposure time is relatively short. However reading using the global shutter may also be executed when the first signal is read from the photoelectric converter 111, of which exposure time is relatively long.

In this case, both the pixel memory 121 and the pixel memory 122 can be used to read the first signal. In concrete terms, the charges stored in the photoelectric converter 111 are held in the pixel memory 121 for a different duration depending on the row, and then the charges are transferred to the pixel memory 122, converted into the voltage signal, and read using the source follower 152.

However if reading using the global shutter is executed for the photoelectric converter 111 of which exposure time is relatively long, then the frame rate drops for the amount of time for holding the charges in the pixel memory 121. On the other hand, in the case of executing reading using the global shutter for the photoelectric converter 112 of which exposure time is relatively short, the frame rate does not drop even if reading using the global shutter is executed, because the time Tfd for holding the charges occurs during exposure of the photoelectric converter 111. Therefore it is preferable that reading using the global shutter is executed to read a signal from the photoelectric converter 112 of which exposure time is relatively short, and reading using the rolling shutter is executed to read a signal from the photoelectric converter 111 of which exposure time is relatively long. By this configuration, the quality of the image acquired by the photoelectric converter 112 can be improved without dropping the frame rate, compared with the conventional solid-state image sensor.

<Modification of Pixel Configuration>

The above is the case when the pixel shown in FIG. 4A is used, but even if the pixel shown in FIG. 3 or 4B is used, reading using the global shutter can be executed according to a same operation flow.

Example 2: Applied to High-Speed Reading

In Example 2, a solid-state image sensor that improves the frame rate by using both pixel memories 121 and 122 to read the signal from the photoelectric converter will be described. In the case of the solid-state image sensor according to Example 2, the frame rate is improved by changing a signal line to read the first pixel signal based on the charges stored in the photoelectric converter 111, depending on the row. In the following, a case of using the pixel shown in FIG. 4A will be described as an example.

<Operation Flow>

FIGS. 7A to 7D are diagrams depicting the operation flow to improve the frame rate in the solid-state image sensor of Example 2. FIGS. 7A to 7D show the respective operation flow in a plurality of pixels 110a, 110b, 110c and 110d which are arranged adjacent to each other on a same column. The operation of each pixel is controlled based on the signal from the scanning circuit. The characters a to d attached to each reference sign in each diagram correspond to the pixels 110a, 110b, 110c and 110d, but the characters a to d are omitted if the description is common to all the pixels. In FIGS. 7A to 7D, the times T1cd to T8cd are timings that are shifted (delayed) from the time T1ab to T8ab by a predetermined time respectively. Further, FIGS. 7A to 7D also indicate the exposure times Tex1 and Tex2 of the photoelectric converters 111 and 112.

As shown in FIGS. 7A to 7D, the operation flow in the first pixels (pixel 110a and pixel 110c) is different from the operation flow in the second pixels (pixel 110b and pixel 110d). The first pixel and the second pixel are alternately disposed in the column direction. In the following, the operation flow in the first pixels and in the second pixels will be described in sequence.

First the operation flow in the first pixels (pixel 110a and pixel 110c) will be described. The transistors 131, 132, 133 and 141 are turned ON to reset the photoelectric converters 111 and 112 and the pixel memories 121 and 122. Then at time T1, the transfer transistors 131 and 132 are turned OFF to start exposure of the photoelectric converters 111 and 112.

After turning the transistors 133 and 141 OFF, the select transistor 162 is turned ON at time T2 to read the reading noise of the source follower 152. Then at time T3, the transfer transistor 132 is turned ON to end the exposure of the photoelectric converter 112 and transfer the charges stored in the photoelectric converter 112 to the pixel memory 122.

Then at time T4, the select transistor 162 is turned ON to convert the charges held in the pixel memory 122 into a voltage signal and read the voltage signal. Then correlated double sampling is performed to subtract the noise component which was read at time T2. Thereby the second pixel signal based on the charges stored in the photoelectric converter 112 can be acquired.

Then the first pixel signal based on the charges stored in the photoelectric converter 111 is acquired. The transistors 133 and 141 are turned ON and OFF to reset the pixel memories 121 and 122, and then at time T5 the select transistor 162 is turned ON to read the reading noise of the source follower 152. Then at time T6, the transfer transistor 131 is turned ON to end the exposure of the photoelectric converter 111 and transfer the charges stored in the photoelectric converter 111 to the pixel memory 121.

Than at time T7, the transistor 133 is turned ON to transfer the charges held in the pixel memory 121 to the pixel memory 122. Then the select transistor 162 is turned ON to read the signal based on the charges held in the pixel memory 122, that is, the charges stored in the photoelectric converter 111. Then correlated double sampling is performed to subtract the noise component which was read at time T5, whereby the first pixel signal can be acquired. Alternatively, similarly to Example 1, when the charges stored in the photoelectric converter 111 are read, correlated double sampling may be performed to subtract the reading noise which was acquired at time T2, instead of the reading noise which was read at time T5.

As described above, in the first pixels (pixels 110a and 110c), the charges stored in the photoelectric converter 111 are transferred to the pixel memory 121, transferred to the pixel memory 122, then converted into the voltage signal using the source follower 152, and read via the signal line 172.

Now the operation flow in the second pixels (pixel 110b and pixel 110d) will be described. The operation flow to acquire the second pixel signal (T1 to T4) in the pixel 110b and the pixel 110d are the same as that in the pixel 110a and the pixel 110c, therefore the description thereof is omitted.

After acquiring the second pixel signal in the pixel 110b and the pixel 110d, the transistor 141 is turned ON and OFF to reset the pixel memory 121. Then at time T5, the select transistor 161 is turned ON to read the reading noise of the source follower 151.

Then at time T6, the transfer transistor 131 is turned ON to end the exposure of the photoelectric converter 111 and transfer the charges stored in the photoelectric converter 111 to the pixel memory 121. Then at time T8, the select transistor 161 is turned ON to convert the charges held in the pixel memory 121 into a voltage signal and read the voltage signal. Then correlated double sampling is performed to subtract the noise component which was read at time T5, whereby the first pixel signal can be acquired.

As described above, in the second pixels (pixels 110b and 110d), the charges stored in the photoelectric converter 111 are transferred to the pixel memory 121, and then converted into a voltage signal using the source follower 151 and read via the signal line 171. In other words, different signal lines are used in the first pixel and the second pixel to acquire the first signal. Thereby the signal processing in subsequent steps, such as correlated double sampling, can be performed in parallel, and the time required for the signal processing can be reduced. As a result, the frame rate to acquire the image can be improved.

<Potential Difference Between Pixel Memories>

In the first pixels (pixel 110a and pixel 110c) of the solid-state image sensor shown in Example 2, the charges are transferred from the pixel memory 121 to the pixel memory 122, but not from the pixel memory 122 to the pixel memory 121. Therefore in the first pixels, in order to completely transfer the charges from the pixel memory 121 to the pixel memory 122, it is preferable that the potential well of the pixel memory 122 is deeper than the potential well of the pixel memory 121. In concrete terms, it is preferable that the concentration of impurities to form the PN junction of the pixel memory 122 is higher than the concentration of impurities of the pixel memory 121. For example, in the case of the NMOS type, where the PN junction is formed by implanting donor impurities into a p-type well, the concentration of donor impurities to be implanted into the region of the pixel memory 122 is set to be higher than the concentration of the donor impurities to be implanted into the region of the pixel memory 121. Typically, it is preferable that the average concentration of impurities in the pixel memory 122 is two times or more the average concentration of impurities of the pixel memory 121.

<Omission of One Source Follower>

Figure 8:
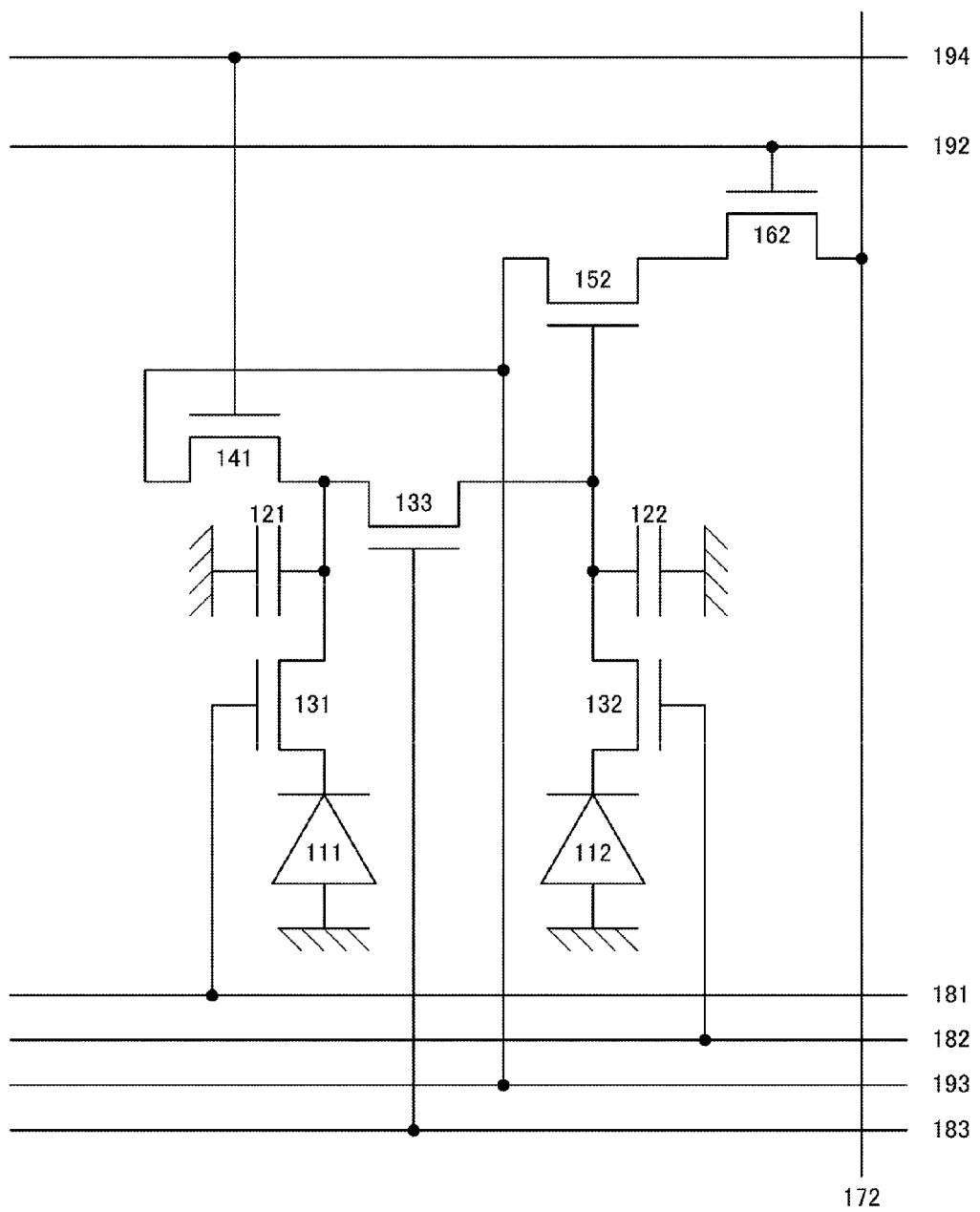
FIG. 8 is a modification of the circuit diagram of a pixel of the solid-state image sensor according to Example 2.

In the first pixels (pixels 110a and 110c) of the solid-state image sensor according to Example 2, the charges stored in the photoelectric converters 111 and 112 are both read using the source follower 152, the select transistor 162 and the signal line 172, which are connected to the pixel memory 122. This means that for the pixels 110a and 110c, the source follower 151, the select transistor 161, the signal line 171 and the selection line 191, which are connected to the pixel memory 121, need not be disposed as shown in FIG. 8. By using the configuration in FIG. 8, a number of transistors and a number of wirings that are required can be decreased, compared with a conventional solid-state image sensor. As a result, the aperture ratios of the photoelectric converters 111 and 112 can be increased to improve the sensitivity, and manufacturing of the solid-state image sensor becomes easier, making it even more preferable. In other words, it is more preferable that the first pixel includes only one converter to convert the charges held in the pixel memory into the voltage signal, and the converter is connected to the second pixel memory 122.

<Arrangement of First Pixel and Second Pixel: Divided Vertically>

In the examples of FIGS. 7A to 7D, the first pixels are arranged on odd rows and the second pixels are arranged on even rows, but the first pixels and the second pixels need not be separated into odd and even rows. For example, the upper pixels 110a and 110b and the lower pixels 110c and 110d may use different signal lines.

Figure 9A:
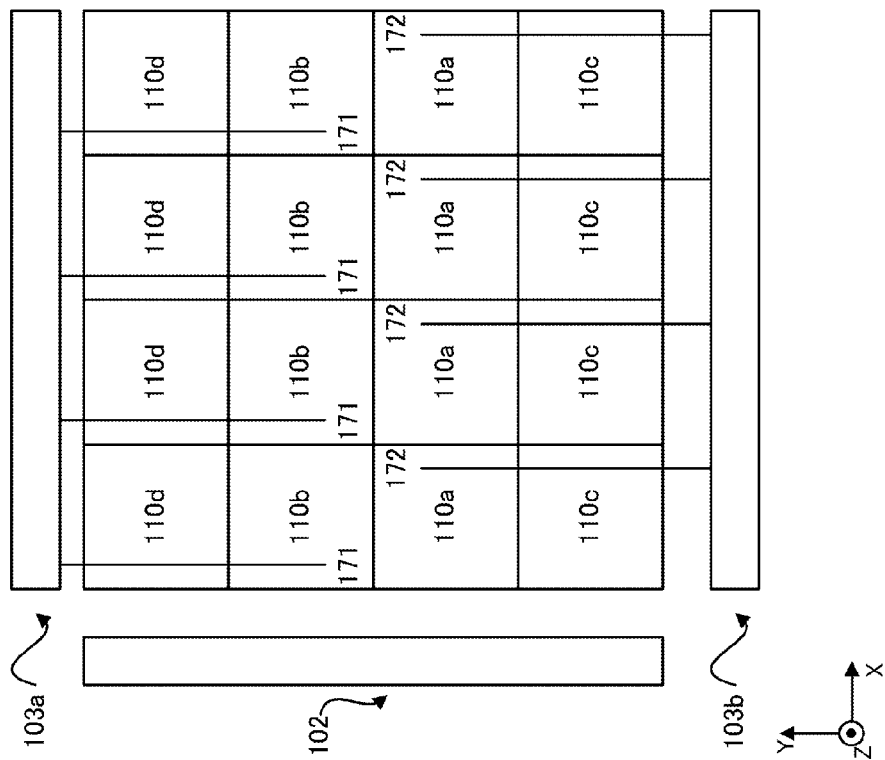
FIGS. 9A and 9B are modifications of the solid-state image sensor according to Example 2.

If the horizontal scanning circuit 103a which is connected to the signal line 171 and the horizontal scanning circuit 103b which is connected to the signal line 172 are disposed at the top and bottom, it is preferable that the first pixel which uses the signal line 172 and the second pixel which uses the signal line 171 are disposed in the column direction (Y direction). For example, as shown in FIG. 9A, a case when the horizontal scanning circuit 103a which is connected to the signal line 171 is disposed on the upper side, and the horizontal scanning circuit 103b which is connected to the signal line 172 is disposed on the lower side, is considered. In this case, the second signals 110b and 110d which use the signal line 171 are disposed on the upper half, and the first signals 110a and 110c which use the signal line 172 are disposed on the lower half, and then the signal line 171 can be connected only to the pixel disposed on the upper half. Then the length of the signal line 171 can be decreased, and the parasitic capacitance of the signal line 171 can be reduced.

<Arrangement of First Pixel and Second Pixel: Disposed Alternately>

On the other hand, in the case when the source follower 151 and the select transistor 161 are not disposed for a part of the pixels, as shown in FIG. 8, it is preferable that the first pixel which uses the signal line 172 and the second pixel which uses the signal line 171 are alternately disposed in the column direction, as shown in FIGS. 7A to 7D. If the configuration of FIGS. 7A to 7D is used, a part of the transistors on pixels in an even row, where many transistors are required, can be disposed on pixels in an odd row. As a result, even if pixels, which require a different number of transistors, coexist, the symmetry of the wiring can be favorably improved.

<Reading Second Pixel Signal after Transfer>

In the example of FIGS. 7A to 7D, the signal line 171 and the signal line 172 are used only when the first pixel signal is read, but the signal line 171 and the signal line 172 may also be used when the second pixel signal is read. In concrete terms, in a part of the plurality of pixels, the charges stored in the photoelectric converter 112 are transferred to the pixel memory 122, and then transferred to the pixel memory 121 and read.

In this case, for a first pixel that uses the signal line 172 to read the first pixel signal, it is preferable to use the signal line 172 to read the second pixel signal. In the same manner, for a second pixel that uses the signal line 171 to read the first pixel signal, it is preferable to use the signal line 171 to read the second pixel signal. In other words, the following operation flow is preferable. For the first pixels (pixels 110a and 110c), the charges stored in the photoelectric converter 112 are transferred to the pixel memory 122 and converted into a voltage signal using the source follower 152. For the second pixels (pixels 110b and 110d), on the other hand, the charges stored in the photoelectric converter 112 are transferred to the pixel memory 122, transferred to the pixel memory 121 again by the transistor 133, and converted into a voltage signal using the source follower 151. The reason for this operation will now be described.

As mentioned above, in the first pixels the potential well of the pixel memory 121 is preferably deeper than the potential well of the pixel memory 122 when the first signal is read, to completely transfer the charges from the pixel memory 121 to the pixel memory 122. If the first pixel has this configuration, however, it is difficult to completely transfer the charges from the pixel memory 122 to the pixel memory 121. In order to use the signal line 171 to read the second pixel signal, it is preferable to completely transfer the charges from the pixel memory 122 to the pixel memory 121, hence using the signal line 171 to read the second pixel signal in the first pixel is difficult.

In the second pixel, on the other hand, charges are not transferred between the pixel memories to read the first signal. Therefore in the second pixel, the potential well of the pixel memory 122 is made to be deeper than the potential well of the pixel memory 121, so that the charges can be completed transferred from the pixel memory 122 to the pixel memory 121 easily. Therefore to read the second pixel, it is easy to completely transfer the charges from the pixel memory 122 to the pixel memory 121, and read the signal using the signal line 171.

As described above, for the first pixels, it is preferable to use the signal line 171 to read both the first and second pixel signals, and for the second pixels, it is preferable to use the signal line 172 to read both the first and second pixel signals. If this configuration is used, it is unnecessary to dispose the source follower 152, the select transistor 162 and the signal line 172, which are connected to the pixel memory 121, and the selection line 192 in the second pixel. As a result, the aperture ratios of the photoelectric converters 111 and 112 can be increased to improve sensitivity, and manufacturing of the solid-state image sensor becomes easier, making it even more preferable.

Figure 9B:
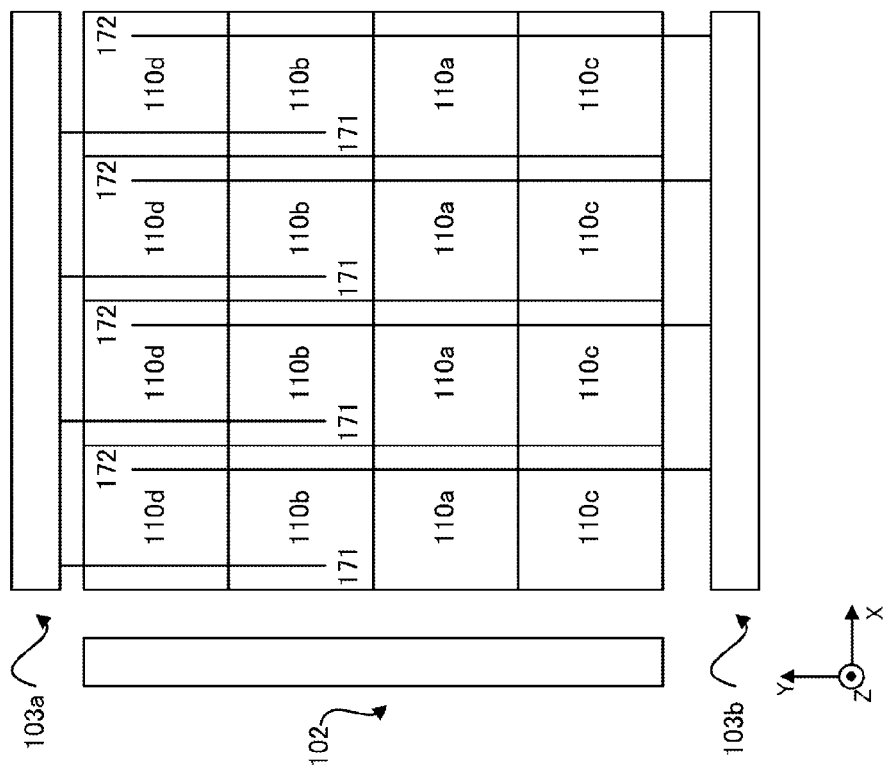

Furthermore, when this configuration is used and the horizontal scanning circuit 103a connected to the signal line 171 and the horizontal scanning circuit 103b connected to the signal line 172 are disposed at the top and bottom, it is preferable that the first pixels and the second pixels are disposed in the column direction (Y direction). For example, as shown in FIG. 9B, a case of disposing the horizontal scanning circuit 103a connected to the signal line 171 on the upper side and disposing the horizontal scanning circuit 103b connected to the signal line 172 on the lower side is considered. In this case, if the second pixels 110b and 110d, which use the signal line 171, are disposed on the upper half, and the first pixels 110a and 110c, which use the signal line 172, are disposed on the lower half, then the signal line 171 can be connected only to the pixels on the upper half, and the signal line 172 can be connected only to the pixels on the lower half. Therefore the lengths of the signal line 171 and the signal line 172 can be decreased, and the parasitic capacitance of the signal line 171 and the signal line 172 can be reduced. Further, the length of the signal line 171 and that of the signal line 172 become the same, which improves the symmetry of wirings.

<Using Only One Signal Line for Short Exposure Time Side>

In terms of conserving power consumption, it is preferable to read the second pixel signal using only the signal line 172. The reason for this will be described next. The frame rate is the same whether the second pixel signal is read using only the signal line 172 or by both the signals lines 171 and 172, since the exposure time of the photoelectric converter 112 is shorter than the exposure time of the photoelectric converter 111. If the charges are transferred between the pixel memories, power is consumed, hence it is preferable that a plurality of signal lines are used for the first pixel signal, which improves the frame rate, and only the signal line 172 is used for the second pixel signal, which does not improve the frame rate even if a plurality of signal lines are used.

<Modification of Pixel Configuration>

The above is the case when the pixel shown in FIG. 4A is used, but even if the pixel shown in FIG. 3 or 4B is used, the frame rate can be improved by using the above operation flow in the same manner.

Example 3: Applied to HDR

In Example 3, a solid-state image sensor, that can expand the dynamic range of the image by using both the pixel memories 121 and 122 to read the signal from the photoelectric converter, will be described. In the following, a case of expanding the dynamic range of the image that is generated by the second pixel signal based on the charges stored in the photoelectric converter 112, using the pixel shown in FIG. 4A, will be described as an example.

<Operation Flow>

Figure 10:
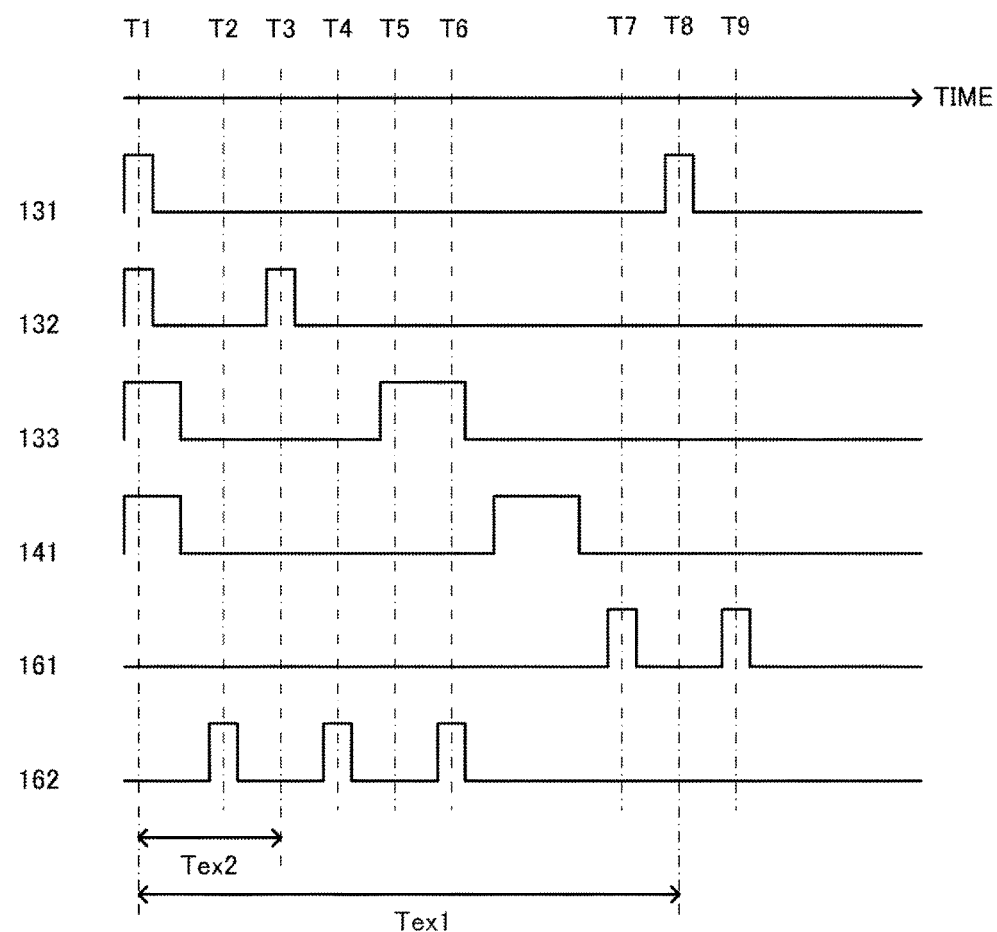
FIG. 10 shows an operation flow of a solid-state image sensor according to Example 3.

FIG. 10 is a diagram depicting the operation flow to expand the dynamic range of the image that is generated using the second pixel signal in the solid-state image sensor of Example 3. The operation of each pixel is controlled based on the signal from the scanning circuit.

First the transistors 131, 132, 133 and 141 are turned ON to reset the photoelectric converters 111 and 112, and the pixel memories 121 and 122. Then at time T1, the transfer transistors 131 and 132 are turned OFF to start the exposure of the photoelectric converters 111 and 112.

After turning the transistors 133 and 141 OFF, the select transistor 162 is turned ON at time T2, and the reading noise of the source follower 152 is read. Then at time T3, the transfer transistor 132 is turned ON to end the exposure of the photoelectric converter 112 and transfer the charges stored in the photoelectric converter 112 to the pixel memory 122.

Then at time T4, the select transistor 162 is turned ON to convert the charges held in the pixel memory 122 into a voltage signal using the source follower 152, and read the voltage signal via the signal line 171 (this signal is hereafter called "voltage signal 171"). Then at time T5, the transistor 133 is turned ON without resetting the charges stored in the pixel memory 122, to connect the pixel memory 121 and the pixel memory 122. Thereby the charges held in the pixel memory 122 is split into the pixel memories 121 and 122, and held by the pixel memories 121 and 122 respectively. Then at time T6, the select transistor 162 is turned ON while keeping the transistor 133 ON, to convert the charges held in the pixel memory 121 and the pixel memory 122 into a voltage signal using the source follower 152, and read the voltage signal via the signal line 172 (this signal is hereafter called "voltage signal 172"). Then correlated double sampling is performed to subtract the reading noise from the voltage signal 171, so as to generate a high sensitivity signal. In the same manner, correlated double sampling is performed to subtract the reading noise from the voltage signal 172, so as to generate a low sensitivity signal.

Then the first pixel signal based on the charges stored in the photoelectric converter 111 is read. This operation flow, which is the same as FIGS. 5A to 5D, is omitted.

As described above, in the solid-state image sensor according to Embodiment 3, when the charges stored in the photoelectric converter 112 are read, a plurality of signals are acquired with changing the capacitance of the image memory. Thereby the dynamic range of the image, which is generated by the second pixel signal, can be expanded. This will be described herein below.

The voltage signal converted by the source follower is a value generated by dividing the charge amount held in the pixel memory connected to the source follower by the capacitance of the pixel memory. By connecting the pixel memory 121 and the pixel memory 122, only the capacitance can be increased while not changing the charge amount held in the pixel memory. Therefore the signal value is higher in the high sensitivity signal than in the low sensitivity signal.

In the conventional solid-state image sensor, the signal stored in the second photoelectric converter 1012 is transferred to the pixel memory 1022, and an image is generated using only the voltage signal 1071 converted by the source follower 1052. Therefore in some cases when the brightness of the object is high, the voltage signal 1071 may be saturated, and white clipping may be generated.

In the case of the solid-state image sensor according to Example 3, on the other hand, the voltage signal 172 is acquired in addition to the voltage signal 171, hence the low sensitivity signal can be used if the brightness of the object is high, and the high sensitivity signal can be used if the brightness of the object is low, whereby the dynamic range of the image can be expanded.

<Potential Difference Between Pixel Memories>

In the solid-state image sensors according to Example 1 and Example 2, the charges are transferred from one pixel memory to the other pixel memory by turning the transistor 133 ON. In the solid-state image sensor according to Example 3, on the other hand, it is preferable to operate such that the charges are split into the pixel memories 121 and 122, and held there by turning the transistor 133 ON. Therefore it is preferable that the depth of the potential well of the pixel memory 121 and that of the pixel memory 122 are about the same. In concrete terms, it is preferable that the concentration of impurities to form the PN junction of the pixel memory 121 and that of the pixel memory 122 are the same. Typically the average concentration of impurities in the pixel memory 121 is half or more and two times or less of the average concentration of impurities in the pixel memory 122.

<Using First Photoelectric Converter for Reading>

In the example of FIG. 10, the dynamic range is expanded by connecting the pixel memories only when the charges stored in the photoelectric converter 112 are read, but the same method may be used to read the charges stored in the photoelectric converter 111. In concrete terms, after acquiring the voltage signal for high sensitivity by transferring the charges stored in the photoelectric converter 111 to the pixel memory 121, the voltage signal for low sensitivity is acquired by connecting the pixel memories 121 and 122 using the transistor 133. Furthermore, the dynamic range may be expanded by connecting the pixel memories only when the charges stored in the photoelectric converter 111 are read.

In this case, it is even more preferable if the method of reading the photoelectric converter 111 is changed depending on the brightness distribution of the object in the image acquired by the photoelectric converter 112. In concrete terms, a high sensitivity signal is acquired from the pixel memory 121 in a region where the brightness of the object is low, and a low sensitivity signal is acquired by connecting the pixel memories 121 and 122 in a region where the brightness of the object is high.

<Determining Exposure Time>

In Examples 1, 2 and 3 described above, the exposure duration of the photoelectric converter 111 and the photoelectric converter 112 can be determined by the speed of motion of the object and the frame rate. As described above, it is preferable that the exposure time of the moving image is set to be similar to the frame rate, and the exposure time of the still image is determined depending on the speed of the motion of the object.

Example 4: Imaging Apparatus

Figure 11:
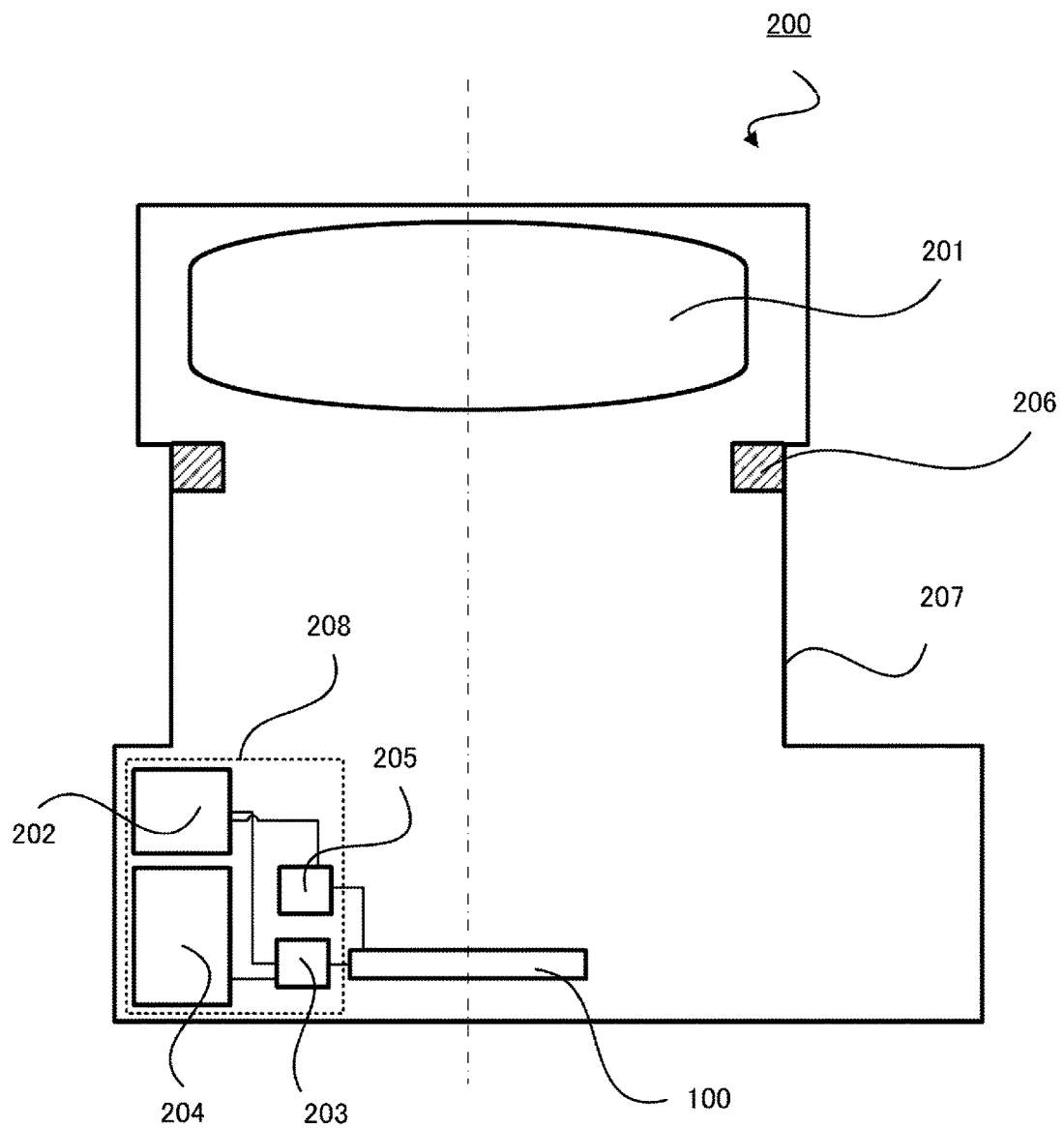
FIG. 11 is a diagram depicting an imaging apparatus according to Example 4.

FIG. 11 is a schematic diagram of an imaging apparatus 200 that includes the solid-state image sensor 100 according to the present invention. The imaging apparatus 200 includes: a case 207 having a lens installation area 206 for installing an imaging lens 201; the solid-state image sensor 100; a controller 208 configured to control the operation of the imaging apparatus 200; and an imaging lens 201 that receives external light into the case. The imaging lens 201 is installed in the case 207 using the lens installation area 206. The imaging apparatus 200 can have such a configuration that the imaging lens 201 may be detached from the case 207 for replacement, or may have such a configuration that replacement is not possible. The controller includes a CPU 202, a transfer circuit 203, a signal processor 204, and an element driving circuit 205.

The CPU 202 is a circuit for controlling the transfer circuit 203, the signal processor 204 and the element driving circuit 205. The element driving circuit 205 is a circuit for driving the solid-state image sensor 100 by receiving a signal from the CPU 202, and controls, for example, the exposure time of the photoelectric converter, which is set for each pixel, and the timing for reading the signal acquired by the photoelectric converter. The transfer circuit 203 stores the signal read from the solid-state image sensor 100, or transfer the signal to the signal processor 204. The signal processor 204 performs image processing for a signal acquired via the transfer circuit 203.

By operating the imaging apparatus such that the exposure time of the first photoelectric converter becomes longer than the exposure time of the second photoelectric converter, a signal for a still image and a signal for a moving image, having different exposure times, can be acquired simultaneously. The exposure time for a still image is determined by the user, and the exposure time for a moving image is set to a value about the same as the frame rate of the solid-state image sensor in advance. Then using a signal for a still image and a signal for a moving image to be acquired, the still image and moving image can be generated simultaneously.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-148895, filed on Jul. 28, 2015, which is hereby incorporated by reference herein in its entirety.

What is claimed is:

1. An imaging apparatus comprising a plurality of pixels, each of the pixels including:
   a first photoelectric converter;
   a first pixel memory;
   a first transfer unit configured to transfer charges from the first photoelectric converter to the first pixel memory;
   a second photoelectric converter;
   a second pixel memory;
   a second transfer unit configured to transfer charges from the second photoelectric converter to the second pixel memory;
   a micro-lens that overlaps with the first and second photoelectric converters when viewed from an optical axis direction of the micro-lens; and
   a switch adapted to control an electric connection state between the first pixel memory and the second pixel memory,
   wherein an exposure time of the first photoelectric converter is longer than an exposure time of the second photoelectric converter,
   wherein in each pixel, the micro-lens collects incident light to the first photoelectric converter and the second photoelectric converter, and
   wherein in each pixel disposed in a center region, an optical axis of the micro-lens is located closer to the second photoelectric converter than to the first photoelectric converter.

2. The imaging apparatus according to claim 1, wherein a sensitivity of the first photoelectric converter is lower than a sensitivity of the second photoelectric converter.

3. The imaging apparatus according to claim 1, wherein each of the pixels includes either (i) a first reset unit connected to the first pixel memory and adapted to reset the charges stored in the first pixel memory or (ii) a second reset unit connected to the second pixel memory and adapted to reset the charges stored in the second pixel memory.

4. The imaging apparatus according to claim 1, further comprising a scanning circuit for reading a pixel signal acquired by the first photoelectric converter or the second photoelectric converter in the plurality of pixels,
   wherein the switch controls the connection state using a signal from the scanning circuit.

5. The imaging apparatus according to claim 1, wherein when a second pixel signal, based on the charges stored in the second photoelectric converter, is acquired:
   the charges are transferred from the second photoelectric converter to the second pixel memory, and an amount of the charges stored in the second pixel memory is converted into a voltage signal and read, and then
   the first pixel memory and the second pixel memory are electrically connected by controlling the switch, and an amount of the charges held in the first pixel memory and the second pixel memory is converted into a voltage signal and read.

6. The imaging apparatus according to claim 1, further comprising a controller configured to control the plurality of pixels,
   wherein the controller controls the plurality of pixels so that the exposure time of the first photoelectric converter is longer than the exposure time of the second photoelectric converter.

7. The imaging apparatus according to claim 1, wherein an aperture area of the first photoelectric converter is larger than an aperture area of the second photoelectric converter.

8. The imaging apparatus according to claim 1, wherein when a first pixel signal, based on the charges stored in the first photoelectric converter, is acquired:

the charges are transferred from the first photoelectric converter to the first pixel memory, and an amount of the charges stored in the first pixel memory is converted into a voltage signal and read, and then the first pixel memory and the second pixel memory are electrically connected by controlling the switch, and an amount of the charges held in the first pixel memory and the second pixel memory is converted into a voltage signal and read.

9. The imaging apparatus according to claim 8, wherein a concentration of impurities implanted into a region of the first pixel memory is half or more and two times or less of a concentration of impurities implanted into a region of the second pixel memory.

10. The imaging apparatus according to claim 1, wherein in first pixels which are a part of the plurality of pixels, when a first pixel signal, based on the charges stored in the first photoelectric converter, is acquired:

the charges are transferred from the first photoelectric converter to the first pixel memory, and then by controlling the switch, the charges are transferred from the first pixel memory to the second pixel memory, and an amount of the charges held in the second pixel memory is converted into a voltage signal and read, and in second pixels, which are pixels other than the first pixels in the plurality of pixels, when the first pixel signal is acquired:

charges are transferred from the first photoelectric converter to the first pixel memory, and then an amount of the charges held in the first pixel memory is converted into a voltage signal and read.

11. The imaging apparatus according to claim 10, wherein in the first pixels, when the second pixel signal, based on the charges stored in the second photoelectric converter, is acquired, the charges are transferred from the second photoelectric converter to the second pixel memory, and then a signal, based on the charges held in the second pixel memory, is read, and in the second pixels, when the second pixel signal is acquired, the charges are transferred from the second photoelectric converter to the second pixel memory, then, by controlling the switch, the charges are transferred from the second pixel memory to the first pixel memory, and a signal, based on the charges held in the first pixel memory, is read.

12. The imaging apparatus according to claim 1, wherein when a second pixel signal, based on the charges stored in the second photoelectric converter, is acquired:

the charges are transferred from the second photoelectric converter to the second pixel memory, and then by controlling the switch, the charges are transferred from the second pixel memory to the first pixel memory, and an amount of the charges held in the first pixel memory is converted into a voltage signal and read.

13. The imaging apparatus according to claim 12, wherein the pixels each have only one converter to convert an amount of the charges held in the pixel memory into a voltage signal, and the converter is connected to the first pixel memory.

14. The imaging apparatus according to claim 12, wherein when the second pixel signal is acquired, a duration of a time for holding the charges in the second pixel memory is different for each row in a pixel region having the plurality of pixels.

15. The imaging apparatus according to claim 14, wherein an exposure start time and an exposure end time of the second photoelectric converter are simultaneous for pixels disposed in different rows.

16. An imaging apparatus comprising a plurality of pixels, each of the pixels including:

a first photoelectric converter;

a first pixel memory;

a first transfer unit configured to transfer charges from the first photoelectric converter to the first pixel memory;

a second photoelectric converter;

a second pixel memory;

a second transfer unit configured to transfer charges from the second photoelectric converter to the second pixel memory;

a micro-lens that overlaps with the first and second photoelectric converters when viewed from an optical axis direction of the micro-lens; and a switch adapted to control an electric connection state between the first pixel memory and the second pixel memory, wherein an exposure time of the first photoelectric converter is longer than an exposure time of the second photoelectric converter, wherein the pixels each include a wave guide for collecting the incident light to the first photoelectric converter and the second photoelectric converter, and wherein in each pixel disposed in a center region, a center of an emission end of a core of the wave guide is located closer to the second photoelectric converter than to the first photoelectric converter.

17. The imaging apparatus according to claim 16, wherein a sensitivity of the first photoelectric converter is lower than a sensitivity of the second photoelectric converter.

18. The imaging apparatus according to claim 16, wherein each of the pixels includes either (i) a first reset unit connected to the first pixel memory and adapted to reset the charges stored in the first pixel memory or (ii) a second reset unit connected to the second pixel memory and adapted to reset the charges stored in the second pixel memory.

19. The imaging apparatus according to claim 16, further comprising a scanning circuit for reading a pixel signal acquired by the first photoelectric converter or the second photoelectric converter in the plurality of pixels, wherein the switch controls the connection state using a signal from the scanning circuit.

20. The imaging apparatus according to claim 16, further comprising a controller configured to control the plurality of pixels, wherein the controller controls the plurality of pixels so that the exposure time of the first photoelectric converter is longer than the exposure time of the second photoelectric converter.

* * * * *